(12) United States Patent
Forbes et al.

(10) Patent No.: US 7,485,544 B2
(45) Date of Patent: Feb. 3, 2009

(54) STRAINED SEMICONDUCTOR, DEVICES AND SYSTEMS AND METHODS OF FORMATION

(75) Inventors: Leonard Forbes, Corvallis, OR (US); Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 11/497,632

(22) Filed: Aug. 2, 2006

(65) Prior Publication Data
US 2008/0029840 A1 Feb. 7, 2008

(51) Int. Cl.
H01L 21/76 (2006.01)

(52) U.S. Cl. ............ 438/427; 438/424; 257/E21.545; 257/E21.547

(58) Field of Classification Search ........... 438/424, 438/425, 426, 427, 428, 429, 430; 257/E21.545, 257/E21.546, E21.547, E21.548, E21.549, 257/E21.55
See application file for complete search history.

(56) References Cited

U.S. PATENT DOCUMENTS

| | | | |
|---|---|---|---|
| 5,461,243 A | 10/1995 | Ek et al. | |
| 5,759,898 A | 6/1998 | Ek et al. | |
| 5,879,996 A | 3/1999 | Forbes | |
| 5,963,817 A | 10/1999 | Chu et al. | |
| 6,228,694 B1 | 5/2001 | Doyle et al. | |
| 6,242,324 B1 | 6/2001 | Kub et al. | |
| 6,251,751 B1 | 6/2001 | Chu et al. | |
| 6,261,876 B1 | 7/2001 | Crowder et al. | |
| 6,274,460 B1 | 8/2001 | Delgado et al. | |
| 6,455,397 B1 | 9/2002 | Belford | |
| 6,514,836 B2 | 2/2003 | Belford | |
| 6,515,335 B1 | 2/2003 | Christiansen et al. | |
| 6,593,625 B2 | 7/2003 | Christiansen et al. | |
| 6,649,492 B2 | 11/2003 | Chu et al. | |
| 6,657,276 B1 * | 12/2003 | Karlsson et al. ............ 257/510 |
| 6,689,671 B1 | 2/2004 | Yu et al. | |
| 6,703,648 B1 | 3/2004 | Xiang et al. | |
| 6,717,216 B1 | 4/2004 | Doris et al. | |

(Continued)

OTHER PUBLICATIONS

"U.S. Appl. No. 10/210,373 final office action mailed Jun. 11, 2007", 17 pgs.

(Continued)

Primary Examiner—Walter L Lindsay, Jr.
(74) Attorney, Agent, or Firm—Schwegman, Lundberg & Woessner, P.A.

(57) ABSTRACT

In various method embodiments, a device region is defined in a semiconductor substrate and isolation regions are defined adjacent to the device region. The device region has a channel region, and the isolation regions have volumes. The volumes of the isolation regions are adjusted to provide the channel region with a desired strain. In various embodiments, adjusting the volumes of the isolation regions includes transforming the isolation regions from a crystalline region to an amorphous region to expand the volumes of the isolation regions and provide the channel region with a desired compressive strain. In various embodiments, adjusting the volumes of the isolation regions includes transforming the isolation regions from an amorphous region to a crystalline region to contract the volumes of the isolation regions to provide the channel region with a desired tensile strain. Other aspects and embodiments are provided herein.

35 Claims, 12 Drawing Sheets

U.S. PATENT DOCUMENTS

| | | | |
|---|---|---|---|
| 6,740,913 | B2 | 5/2004 | Doyle et al. |
| 6,855,649 | B2 | 2/2005 | Christiansen et al. |
| 6,902,616 | B1 | 6/2005 | Yamazaki et al. |
| 6,987,037 | B2 | 1/2006 | Forbes |
| 6,994,762 | B2 | 2/2006 | Clingman et al. |
| 7,023,051 | B2 | 4/2006 | Forbes |
| 7,041,575 | B2 | 5/2006 | Forbes |
| 7,045,874 | B2 | 5/2006 | Forbes |
| 7,081,395 | B2 * | 7/2006 | Chi et al. ............... 438/424 |
| 7,084,429 | B2 | 8/2006 | Forbes |
| 7,115,480 | B2 | 10/2006 | Forbes |
| 7,198,974 | B2 | 4/2007 | Forbes |
| 7,202,530 | B2 | 4/2007 | Forbes |
| 7,220,656 | B2 | 5/2007 | Forbes |
| 2002/0135020 | A1 | 9/2002 | Skotnicki et al. |
| 2002/0163045 | A1 | 11/2002 | Farrar |
| 2002/0185686 | A1 | 12/2002 | Christiansen et al. |
| 2003/0013323 | A1 | 1/2003 | Hammond et al. |
| 2003/0201468 | A1 | 10/2003 | Christiansen et al. |
| 2003/0218189 | A1 | 11/2003 | Christiansen et al. |
| 2004/0048450 | A1 | 3/2004 | Tweet et al. |
| 2004/0173798 | A1 | 9/2004 | Forbes |
| 2004/0217352 | A1 | 11/2004 | Forbes |
| 2004/0217391 | A1 | 11/2004 | Forbes |
| 2004/0221792 | A1 | 11/2004 | Forbes |
| 2004/0224480 | A1 | 11/2004 | Forbes |
| 2004/0232422 | A1 | 11/2004 | Forbes |
| 2004/0232487 | A1 | 11/2004 | Forbes |
| 2004/0232488 | A1 | 11/2004 | Forbes |
| 2004/0235264 | A1 | 11/2004 | Forbes |
| 2005/0020094 | A1 | 1/2005 | Forbes et al. |
| 2005/0023529 | A1 | 2/2005 | Forbes |
| 2005/0023612 | A1 | 2/2005 | Forbes |
| 2005/0023616 | A1 | 2/2005 | Forbes |
| 2005/0029619 | A1 | 2/2005 | Forbes |
| 2005/0032296 | A1 | 2/2005 | Forbes |
| 2005/0087842 | A1 | 4/2005 | Forbes |
| 2005/0285139 | A1 | 12/2005 | Forbes |
| 2006/0001094 | A1 | 1/2006 | Forbes |
| 2006/0011982 | A1 | 1/2006 | Forbes |
| 2006/0097281 | A1 | 5/2006 | Forbes |
| 2006/0208343 | A1 | 9/2006 | Forbes |
| 2006/0244105 | A1 | 11/2006 | Forbes et al. |
| 2007/0096193 | A1 | 5/2007 | Forbes |
| 2007/0164361 | A1 | 7/2007 | Forbes |
| 2007/0187683 | A1 | 8/2007 | Forbes |
| 2007/0238320 | A1 | 10/2007 | Bhattacharyya et al. |
| 2008/0042211 | A1 | 2/2008 | Bhattacharyya et al. |

OTHER PUBLICATIONS

"U.S. Appl. No. 10/210,373 non-final office action mailed Jan. 24, 2007", 17 pgs.
"U.S. Appl. No. 10/379,749 Amendment under 37 C.F.R. filed Nov. 1, 2006", 3 pgs.
"U.S. Appl. No. 10/379,749 Notice of allowance mailed Dec. 13, 2004", 6 pgs.
"U.S. Appl. No. 10/379,749 Notice of allowance mailed Aug. 3, 2006", 2 pgs.
"U.S. Appl. No. 10/425,484 non-final office action mailed Jun. 28, 2004", 5 pgs.
"U.S. Appl. No. 10/425,484 Notice of allowance mailed Dec. 20, 2004", 2 pgs.
"U.S. Appl. No. 10/425,484 Notice of allowance mailed Dec. 21, 2006", 4 pgs.
"U.S. Appl. No. 10/425,484 Response filed Sep. 28, 2004 to non-final office action mailed Jun. 28, 2004", 19 pgs.
"U.S. Appl. No. 10/431,134 Amendment under 37 C.F.R. filed Sep. 28, 2005", 16 pgs.
"U.S. Appl. No. 10/431,134 non-final office action mailed Dec. 23, 2004", 5 pgs.
"U.S. Appl. No. 10/431,134 Notice of allowance mailed Jun. 28, 2005", 4 pgs.
"U.S. Appl. No. 10/431,134 Response filed Mar. 23, 2005 to non-final office action mailed Dec. 23, 2004", 19 pgs.
"U.S. Appl. No. 10/431,137 Notice of allowance mailed Jan. 27, 2005", 4 pgs.
"U.S. Appl. No. 10/431,137 Notice of allowance mailed May 19, 2006", 4 pgs.
"U.S. Appl. No. 10/431,137 Notice of allowance mailed May 21, 2004", 7 pgs.
"U.S. Appl. No. 10/623,788 final office action mailed Mar. 29, 2007", 11 pgs.
"U.S. Appl. No. 10/623,788 non-final office action mailed Mar. 29, 2006", 14 pgs.
"U.S. Appl. No. 10/623,788 non-final office action mailed Sep. 18, 2006", 11 pgs.
"U.S. Appl. No. 10/623,788 Response filed Dec. 18, 2006 to non-final office action mailed Sep. 18, 2006", 17 pgs.
"U.S. Appl. No. 10/623,788 Response filed May 29, 2007 to final office action mailed Mar. 29, 2007", 22 pgs.
"U.S. Appl. No. 10/623,788 Response filed Jun. 29, 2006 to non-final office action mailed Mar. 29, 2006", 16 pgs.
"U.S. Appl. No. 10/931,580 non-final office action mailed Feb. 10, 2005", 8 pgs.
"U.S. Appl. No. 10/931,580 non-final office action mailed Jul. 27, 2005", 8 pgs.
"U.S. Appl. No. 10/931,580 Notice of allowance mailed Dec. 22, 2005", 5 pgs.
"U.S. Appl. No. 10/931,580 Response filed Oct. 17, 2005 to non-final office action mailed Jul. 27, 2005", 13 pgs.
"U.S. Appl. No. 10/931,580 Response filed May 10, 2005 to non-final office action mailed Feb. 10, 2005", 15 pgs.
"U.S. Appl. No. 10/931,749 Notice of allowance mailed Sep. 9, 2005", 3 pgs.
"U.S. Appl. No. 10/623,788, Non-Final Office Action mailed Aug. 9, 2007", 11 pgs.
"U.S. Appl. No. 10/623,788, Response filed Nov. 9, 2007 to Non-Final Office Action mailed Aug. 9, 2007", 20 pgs.
"U.S. Appl. No. 11/210,373 Response filed Apr. 24, 2007 to non-final office action mailed Jan. 24, 2007", 9 pgs.
"U.S. Appl. No. 11/210,927 non-final office action mailed Aug. 15, 2006", 5 pgs.
"U.S. Appl. No. 11/210,927 Notice of allowance mailed Nov. 27, 2006", 2 pgs.
"U.S. Appl. No. 11/210,927 Response filed Nov. 6, 2006 to non-final office action mailed Aug. 15, 2006", 9 pgs.
"U.S. Appl. No. 11/707,214, Non-Final Office Action mailed Oct. 12, 2007", 16 pgs.
Bhattacharyya, Arup, et al., "Devices and Methods to Improve Carrier Mobility", U.S. Appl. No. 11/398,809, filed Apr. 6, 2006.
Forbes, L. , "Micromechanical Strained Semiconductor by Wafer Bonding", U.S. Appl. No. 11/432,578, filed May 11, 2006.
Forbes, L. , "Micromechanically Strained Microconductor Film", U.S. Appl. No. 10/379,749, filed Mar. 5, 2003.
Forbes, L. , et al., "Strained Semiconductor by Full Wafer Bonding", U.S. Appl. No. 11/475,798, filed Jun. 27, 2006.
Forbes, Leonard , "Strained Semiconductor, Devices and Systems and Methods of Formation,", U.S. Appl. No. 11/497,632, filed Aug. 2, 2006.
"Cornell Demonstrates a Universal Substrate", *Compound Semiconductor*, 3(2), (Mar./Apr. 1997),27-29.
"Localized Compressive Strained Semiconductor", U.S. Appl. No. 11/356,335, filed Feb. 16, 2006 (Client Ref. No. 05-0954).
Abe, T , "Silicon Wafer-Bonding Process Technology for SOI Structures", *Extended Abstracts of the 22nd (1990 International) Conference on Solid State Devices and Materials*, (1990),853-856.
Aberg, I. , et al., "High electron and hole mobility enhancements in thin-body strained Si/strained SiGe/strained Si heterostructures on insulator", *IEEE International Electron Devices Meeting, 2004. IEDM Technical Digest.*, (Dec. 2004),173-176.

Ang, Kah W., "Enhanced performance in 50 nm N-MOSFETs with silicon-carbon source/drain regions", *IEEE International Electron Devices Meeting, 2004. IEDM Technical Digest.*, (Dec. 2004),1069-1071.

Belford, Rona E., et al., "Performance-Augmented CMOS Using Back-End Uniaxial Strain", *IEEE 60th DRC. Conference Digest Device Research Conference*, 2002, (Jun. 24-26, 2002),41-42.

Berti, M., "Composition and Structure of Si-Ge Layers Produced by Ion Implantation and Laser Melting", *Journal of Materials Research*, 6(10), (Oct. 1991),2120-2126.

Berti, M., "Laser Induced Epitaxial Regrowth of Si[sub 1-x]Ge[sub x]/Si Layers Produced by Ge Ion Implantation", *Applied Surface Science*, 43, (1989),158-164.

Biever, Celeste, "Secret of 'strained silicon' revealed: behind closed doors, Intel has perfected a novel way to improve chip performance.", *New Scientist*, 180(i2426-2428), (Dec. 20, 2003),27.

Cai, J., "Performance Comparison and Channel Length Scaling of Strained Si FETs on SiGe-On-Insulator (SGOI)", *IEEE International Electron Devices Meeting, 2004. IEDM Technical Digest.*, (Dec. 2004),165-168.

Cartagena, E, "Bonded Etchback Silicon on Sapphire Bipolar Junction Transistors",*Extended Abstracts—Electrochemical Society (1)*, Program and Abstracts: 183rd Meeting of the Electrochemical Society, Pennington, NJ,(1993),1199-1200.

Chen, Xiangdong, et al., "Vertical P-MOSFETs with heterojunction between source/drain and channel", *IEEE Device Research Conference*, (2000),25-26.

Chilton, B T., et al., "Solid phase epitaxial regrowth of strained Si(1-x)Ge(x)/Si strained layer structures amorphized by ion implantation", *Applied Physics Letters*, 54(1), (Jan. 2, 1989),42-44.

Chleirigh, C. N., "Mobility and Sub-threshold Characteristics in High-Mobility Dual-Channel Strained Si/Strained SiGe P-MOSFETs", *IEEE Device Research Conference*, Santa Barbara, CA Jun. 20-22, 2005,(2005),203-204.

Choe, K. S., et al., "Minority-Carrier Lifetime Optimization in Silicon MOS Devices by Intrinsic Gettering", *Journal of Crystal Growth*, 218(2-4), (Sep. 2000),239-44.

Chu, T. L., et al., "Films of silicon nitride-silicon dioxide mixtures", *J. Electrochem. Soc.*, 115, (1968),318-321.

Clark, Don, et al., "Intel unveils tiny new transistors: Process handles circuits 1/2000th the width of a human hair", *The Wall Street Journal*, (Aug. 13, 2002),3 pages.

Clifton, P A., et al., "A process for strained silicon n-channel HMOSFETs", *ESSDERC'96. Proceedings of the 26th European Solid State Device Research Conference*, (Sep. 1996),519-22.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998),13-17.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Forbes, Leonard, "Non-Volatile Memory Device With Tensile Strained Silicon Layer", U.S. Appl. No. 11/260,339, filed Oct. 27, 2005, (Client Ref. No. 05-0753), 26 pages.

Forbes, K Y., "Non-Volatile Memory Device with Tensile Strained Silicon Layer", U.S. Appl. No. 11/260,339 (client ref No. 05-0753—Leffert file), 26 pgs.

Fournel, F, et al., "Ultra High Precision Of The Tilt/Twist Misorientation Angles In Silicon/Silicon Direct Wafer Bonding", *Abstract—Electronic Materials Conference*, (Jun. 2002),9.

Garcia, G A., et al., "High-quality CMOS in thin (100 nm) silicon on sapphire", *IEEE Electron Device Letters*, 9(1), (Jan. 1988),32-34.

Ghani, T., "A 90nm High Volume Manufacturing Logic Technology Featuring Novel 45nm Gate Length Strained Silicon CMOS Transistors", *Technical Digest IEEE International Electron Devices Meeting*, (Dec. 2003),978-980.

Goto, K., "Technology Booster using Strain-Enhancing Laminated SiN (SELS) for 65nm Node Hp MPUs", *IEDM Technical Digest. IEEE International Electron Devices Meeting*, (Dec. 2004),209-212.

Haddad, H., et al., "Carbon Doping Effects on Hot Electron Trapping", *28th Annual Proceedings. Reliability Physics 1990*, (Mar. 1990),288-9.

Irie, H., et al., "In-plane mobility anisotropy and universality under uni-axial strains in n and p-MOS inversion layers on (100), [110], and (111) Si", *IEEE International Electron Devices Meeting, 2004. IEDM Technical Digest.*, (Dec. 2004),225-228.

Kal, S., et al., "Strained Silicon-SiGe Devices Using Germanium Implantation", *IETE Journal of Research*, 43 (2-3), (Mar. 1997),185-192.

Kalavade, Pranav, et al., "A novel sub-10 nm transistor", *58th DRC. Device Research Conference. Conference Digest*, (Jun. 19-21, 2000),71-72.

Kawasaki, Hirohisa, "Impact of Parasitic Resistance and Silicon Layer Thickness Scaling for Strained-Silicon MOSFETs on Relaxed Si1-xGex virtual substrate", *IEEE International Electron Devices Meeting, 2004. IEDM Technical Digest.*, (Dec. 2004),169-172.

Komoda, T., "Mobility Improvement for 45nm Node by Combination of Optimized Stress Control and Channel Orientation Design", *IEEE International Electron Devices Meeting, 2004. IEDM Technical Digest.*, (Dec. 2004),217-220.

Kostrzewa, M, et al., "Testing the Feasibility of strain relaxed InAsP and InGaAs compliant substrates", *EMC 2003 International Conference Indium Phosphide and Related Materials. Conference Proceedings*, (Jun. 2003),8.

Lasky, J. B., "Wafer Bonding for Silicon-on-Insulator Technologies", *Applied Physics Letters*, 48(1), (Jan. 6, 1986),78-80.

Maikap, S., "Package-strain-enhanced device and circuit performance", *IEEE International Electron Devices Meeting, 2004. IEDM Technical Digest.*, (Dec. 2004),233-236.

Mizuno, T, et al., "Advanced SOI-MOSFETs with Strained-Si Channel for High Speed CMOS Electron/Hole Mobility Enhancement", *2000 Symposium on VLSI Technology. Digest of Technical Papers*, (2000),210-211.

Moran, Peter, "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract, pp. 8-9.

Numata, Toshinori, "Performance Enhancement of Partially- and Fully-Depleted Strained-SOI MOSFETs and Characterization of Strained-Si Device Parameters", *IEEE International Electron Devices Meeting, 2004. IEDM Technical Digest.*, (Dec. 2004),177-180.

O'Neill, A G., et al., "High speed deep sub-micron MOSFET using high mobility strained silicon channel", *ESSDERC '95. Proceedings of the 25th European Solid State Device Research Conference*, (Sep. 1995),109-12.

Omi, Hiroo, et al., "Semiconductor Surface with Strain Control", http://www.brl.ntt.co.jp/J/kouhou/katsudou/report00/E/report04_e.html.

Paine, D. C., et al., "The Growth of Strained Si]-xGex Alloys on (100) Silicon Using Solid Phase Epitaxy", *Journal of Materials Research*, 5(5), (May 1990),1023-1031.

People, R., "Calculation of critical layer thickness versus lattice mismatch for GexSi1-x/Si strained-layer heterostructures", *Applied Physics Letters*, 47(3), (Aug. 1, 1985),322-324.

Pidin, S., "A Novel Strain Enhanced CMOS Architecture Using Selectively Deposited High Tensile and High Compressive Silicon Nitride Films", *IEEE International Electron Devices Meeting, 2004. IEDM Technical Digest.*, (Dec. 2004),213-216.

Rim, Kern, et al., "Fabrication and analysis of deep submicron strained-Si n-MOSFET's", *IEEE Transactions on Electron Devices*, 47(7), (Jul. 2000),1406-1415.

Rim, Kern, et al., "Strained Si NMOSFETs for High Performance CMOS Technology", *2001 Symposium on VLSI Technology. Digest of Technical Papers*, (2001),59-60.

Rim, Kern, et al., "Transconductance enhancement in deep submicron strained Si n-MOSFETs", *International Electron Devices Meeting 1998. Technical Digest*, (1998),707-710.

Subbanna, Seshadri, "High-Performance Silicon-Germanium Technology", *63rd Device Research Conference Digest, 2005. DRC '05.*, (2005),195-196.

Sugiyama, N, et al., "Formation of strained-silicon layer on thin relaxed- SiGe/SiO/sub 2//Si structure using SIMOX technology", *Thin Solid Films*, 369(1-2), (Jul. 2000),199-202.

Takagi, Shin-Ichi, "Strained-Si- and SiGe-On-Insulator (Strained-SOI and SGOI) MOSFETs for High Performance-Low Power CMOS Application", *IEEE Device Research Conference, 2002. 60th DRC. Conference Digest*, (2002),37-40.

Thompson, S. E., "Key Differences For Process-induced Uniaxial vs. Substrate-induced Biaxial Stressed Si and Ge Channel MOSFETs", *IEEE International Electron Devices Meeting, 2004. IEDM Technical Digest.*, (Dec. 2004),221-224.

Uchida, Ken, "Experimental Study of Biaxial and Uniaxial Strain Effects on Carrier Mobility in Bulk and Ultrathin-body SOI MOSFETs", *IEEE International Electron Devices Meeting, 2004. IEDM Technical Digest.*, (Dec. 2004),229-232.

Verdonckt-Vandebroek, S., et al., "SiGe-channel heterojunction p-MOSFETs", *IEEE Transactions on Electron Devices*, 41(1), (Jan. 1994),90-101.

Welser, J, "Strain dependence of the performance enhancement in strained-Si n-MOSFETs", *IEEE International Electron Devices Meeting 1994. Technical Digest*, (Dec. 11-14, 1994),373-376.

Xiao, Q., et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004),2163-2166.

Yin, Haizhou, "High Ge-Content Relaxed Si1-xGex Layers by Relaxation on Complaint Substrate with Controlled Oxidation", *Electronic Materials Conference*, Santa Barbara, Jun. 2002, 8.

\* cited by examiner

STRAINED SEMICONDUCTOR, DEVICES AND SYSTEMS AND METHODS OF FORMATION

TECHNICAL FIELD

This disclosure relates generally to semiconductor devices, and more particularly, to strained semiconductor, devices and systems, and methods of forming the strained semiconductor, devices and systems.

BACKGROUND

The semiconductor industry continues to strive for improvements in the speed and performance of semiconductor devices. Strained silicon technology has been shown to enhance carrier mobility in both n-channel and p-channel devices, and thus has been of interest to the semiconductor industry as a means to improve device speed and performance. Currently, strained silicon layers are used to increase electron mobility in n-channel CMOS transistors. There has been research and development activity to increase the hole mobility of p-channel CMOS transistors using strained silicon germanium layers on silicon.

FIG. 1A illustrates a known device for improved hole mobility with an n-type silicon substrate 101, a silicon germanium layer 102, a silicon capping layer 103, a gate oxide 104, a gate 105, and N+ source/drain regions 106 and 107. FIG. 1B illustrates a band structure for the device of FIG. 1A, and indicates that some carriers or holes are at the silicon-oxide interface and some are confined in the silicon germanium layer. Both the silicon germanium and the silicon capping layers will be strained if they are thin. Alternatively, the silicon germanium layer may be graded to a relaxed or unstrained layer resulting in more stress in the silicon cap layer. The crystalline silicon layer is strained by a lattice mismatch between the silicon germanium layer and the crystalline silicon layer.

More recently, strained silicon layers have been fabricated on thicker relaxed silicon germanium layers to improve the mobility of electrons in NMOS transistors. Structures with strained silicon on silicon germanium on insulators have been described as well as structures with strained silicon over a localized oxide insulator region. These structures yield high mobility and high performance transistors on a low capacitance insulating substrate.

Wafer bending has been used to investigate the effect of strain on mobility and distinguish between the effects of biaxial stress and uniaxial stress. Bonding a semiconductor onto bowed or bent substrates has been disclosed to introduce strain in the semiconductor. Stress can also be introduced by wafer bonding. Packaging can introduce mechanical stress by bending. Compressively-strained semiconductor layers have been bonded to a substrate.

FIGS. 2-4 illustrate some known techniques to strain channels and improve carrier mobilities in CMOS devices. FIG. 2 illustrates a known device design to improve electron mobility in NMOS transistors using a tensile strained silicon layer on silicon germanium. As illustrated, a graded silicon germanium layer 208 is formed on a p-type silicon substrate 209 to provide a relaxed silicon germanium region 210, upon which a strained silicon layer 211 is grown. The transistor channel is formed in the strained silicon layer 211. There is a large mismatch in the cell structure between the silicon and silicon germanium layers, which biaxially strains the silicon layer. The biaxial strain modifies the band structure and enhances carrier transport in the silicon layer. In an electron inversion layer, the subband splitting is larger in strained silicon because of the strain-induced band splitting in addition to that provided by quantum confinement. As illustrated in FIG. 3, uniaxial compressive stress can be introduced in a channel 312 of a PMOS transistor to improve hole mobility using silicon germanium source/drain regions 313 in trenches adjacent to the PMOS transistor. Large improvements in hole mobility, up to 50%, have been made in PMOS devices in silicon technology using strained silicon germanium source/drain regions to compressively strain the transistor channel. Silicon-carbon source/drain regions in trenches adjacent to an NMOS transistor can introduce tensile stress and improve electron mobility. FIG. 4 illustrates a known device design to improve mobility for both NMOS and PMOS transistors using silicon nitride capping layers 414. These silicon nitride capping layers can be formed to introduce tensile stress for NMOS transistors and can be formed to introduce compressive stress for PMOS transistors.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Disclosed herein, among other things, is a process to adjust a volume of isolation regions to provide device channels regions with a desired strain. Thus, the isolation region volume is expanded to provide a compressive strain for p-channel device, and the isolation region volume is reduced or contracted to provide a tensile strain for n-channel devices. According to various embodiments to improve hole mobility, isolation regions adjacent to the source/drain regions are implanted to provide compressive stress for channels of PMOS transistors. If the isolation regions are crystalline, the implant amorphizes the isolation region, thus expanding the isolation regions. According to various embodiments to improve electron mobility, isolation region trenches are filled with amorphous semiconductor (e.g. amorphous silicon), and then recrystallized to contract the isolation regions and provide tensile strain to an NMOS transistor.

Figure 1A:
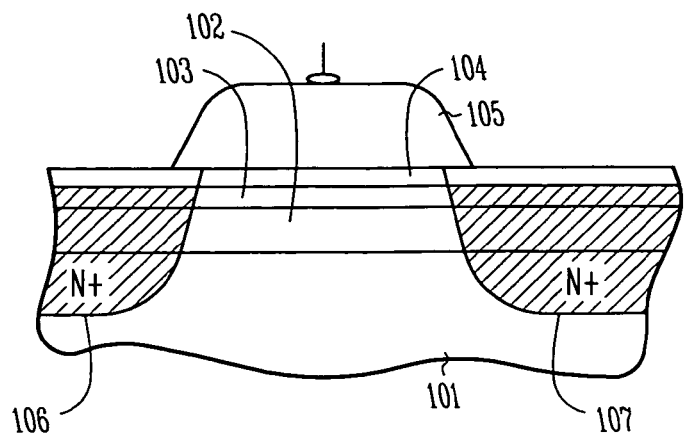
FIG. 1A illustrates a known device for improved hole mobility.
Figure 1B:
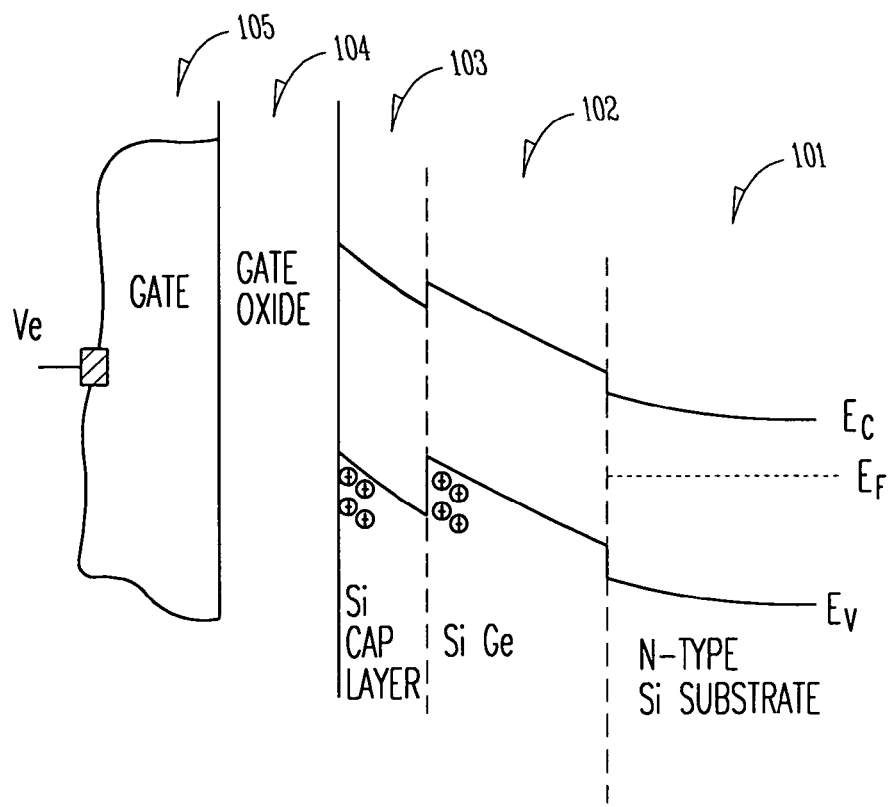
FIG. 1B illustrates a band structure for the device of FIG. 1A.
Figure 2:
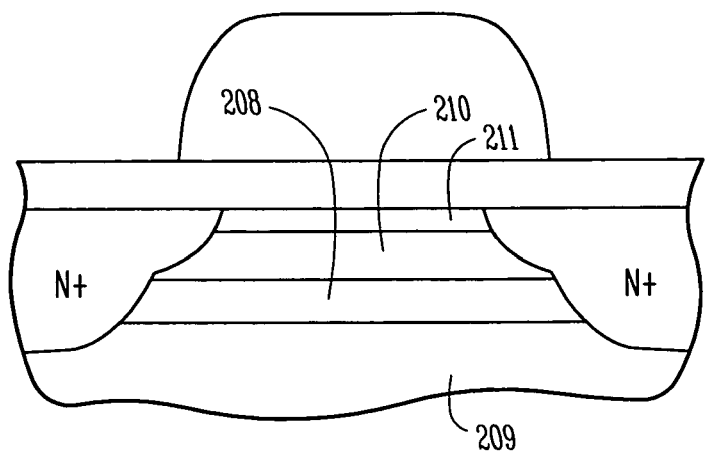
FIG. 2 illustrates a known device design to improve electron mobility in NMOS transistors using a tensile strained silicon layer on silicon germanium.
Figure 3:
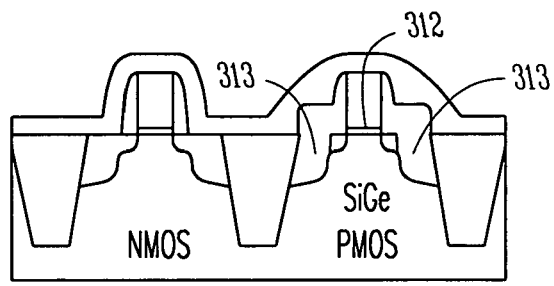
FIG. 3 illustrates a known device design to provide uniaxial compressive stress in a channel of a PMOS transistor using silicon germanium source/drain regions in trenches adjacent to the PMOS transistor.
Figure 4:
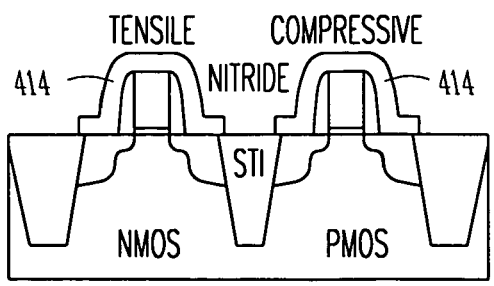
FIG. 4 illustrates a known device design to improve mobility for both NMOS and PMOS transistors using silicon nitride capping layers.
Figure 5A:
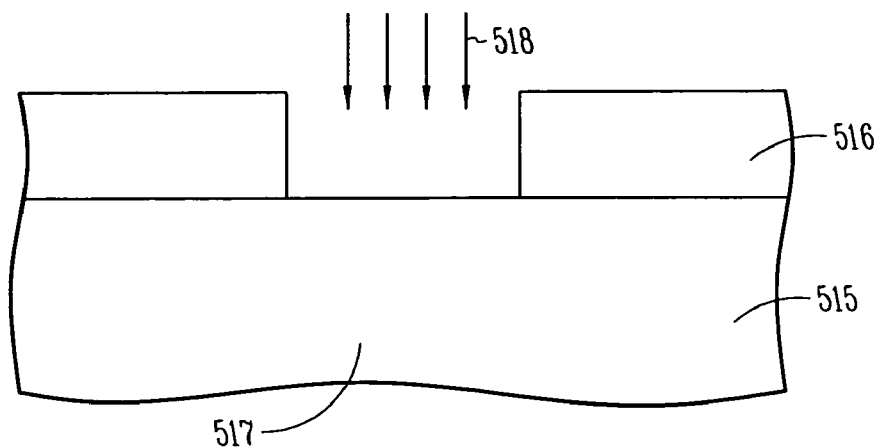
FIGS. 5A-5C illustrate a process for fabricating a transistor with a channel under compressive strain, according to various embodiments of the present subject matter.
Figure 5B:
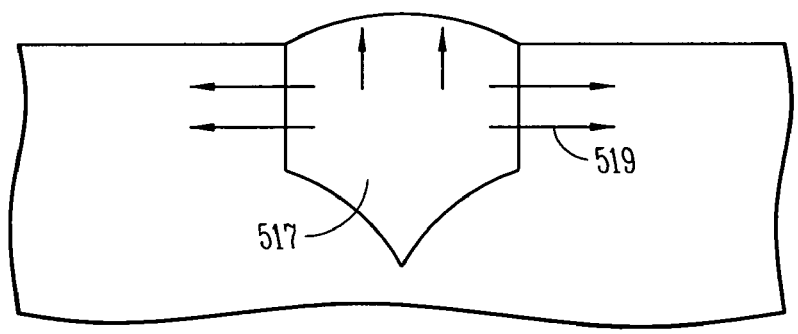
Figure 5C:
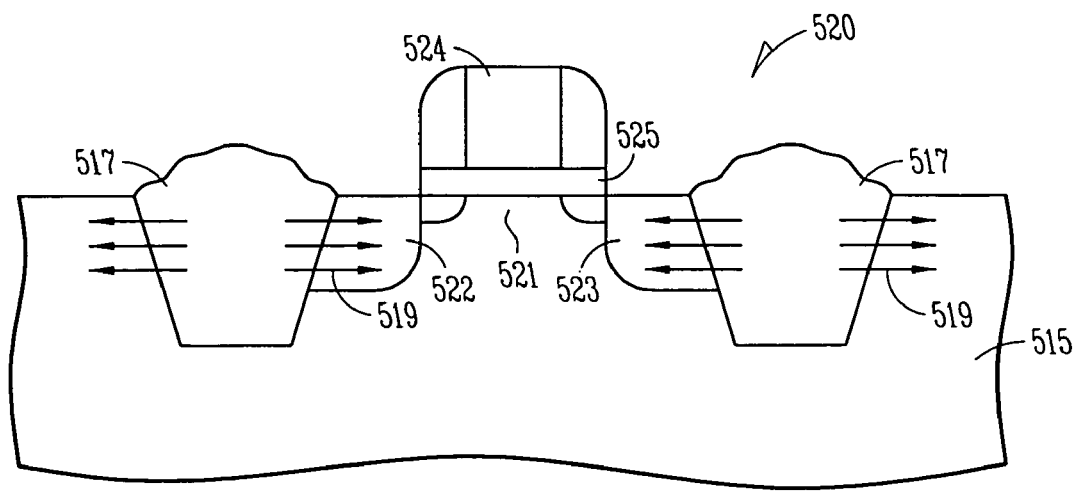

FIGS. 5A-5C illustrate a process for fabricating a transistor with a channel under compressive strain, according to various embodiments of the present subject matter. FIG. 5A illustrates a substrate 515, and a mask 516 formed over the substrate to define isolation regions 517. The illustrated substrate is a crystalline semiconductor, such as a crystalline silicon wafer. An implant, illustrated by arrows 518, is performed. The implant functions to transform the crystalline isolation regions into amorphous isolation regions. This process is sometimes referred to herein as amorphizing the substrate. According to various embodiments, the implant includes silicon ions implanted into a silicon substrate. Some embodiments implant the substrate with inert gas atoms. The amorphous isolation regions have a lower density than the crystalline isolation regions. After the implant, there are more atoms in the original volume or space, which causes the volume of the implanted isolation region 517 to expand, as illustrated by the arrows 519 in FIG. 5B. The expanding isolation regions push against the adjacent crystalline regions, in which a device channel is to be formed. Thus, the expanding isolation regions compress the adjacent crystalline isolation regions.

FIG. 5C illustrates a PMOS transistor 520 with a compressed p-channel 521 to improve hole mobility, according to various embodiments. The illustrated device 520 includes a first source/drain region 522 and a second source/drain region 523 that define the channel region 521 in the crystalline substrate. A gate 524 is separated from the channel region 521 by a gate insulator 525. The implanted isolation regions 517 cause the crystalline substrate upon which the PMOS transistor is formed to be under compressive stress, as illustrated by the arrows 519.

Figure 6A:
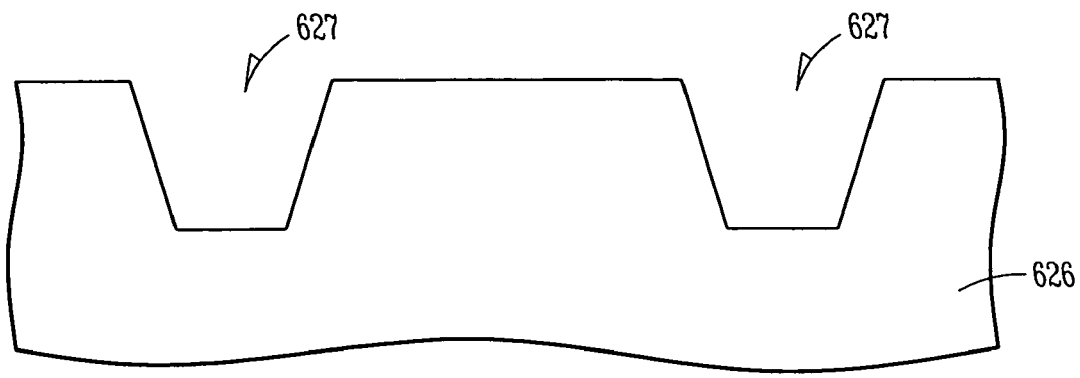
FIGS. 6A-6E illustrate a process for fabricating a transistor with a channel under tensile strain, according to various embodiments of the present subject matter.
Figure 6B:
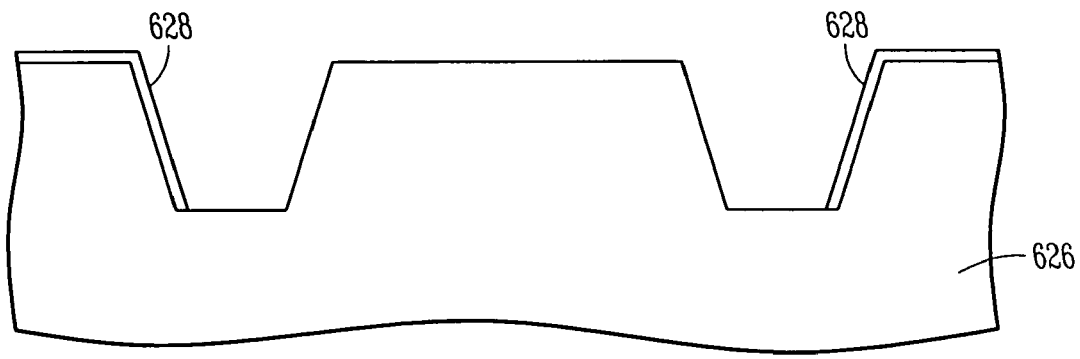
Figure 6C:
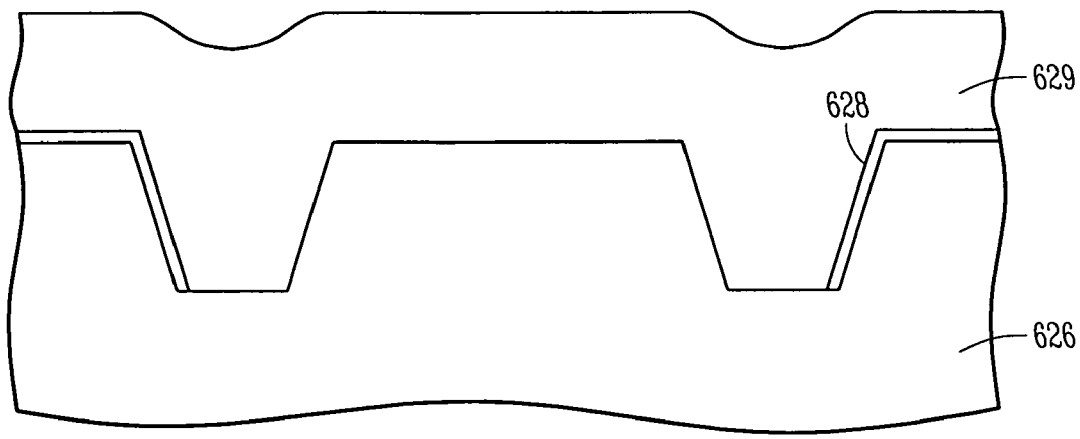
Figure 6D:
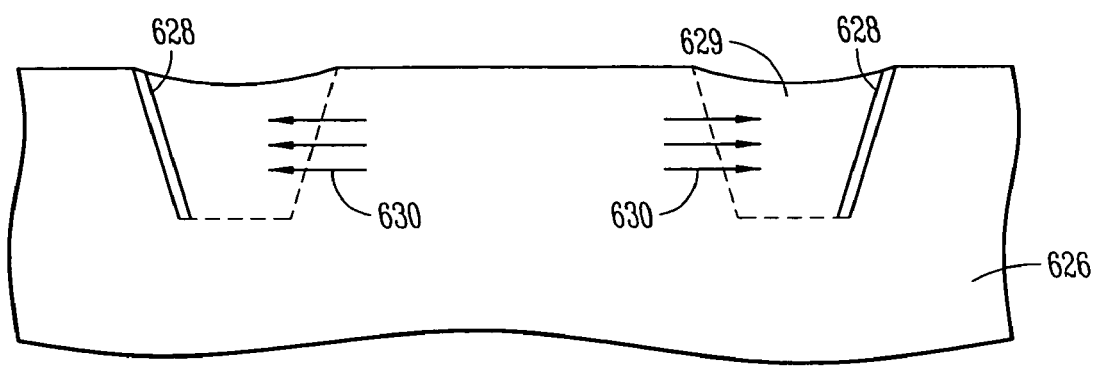

FIGS. 6A-6E illustrate a process for fabricating a transistor with a channel under tensile strain, according to various embodiments of the present subject matter. FIG. 6A illustrates a substrate 626, and trenched isolation regions 627. The illustrated substrate is a crystalline semiconductor, such as a crystalline silicon wafer. The trench can be etched using conventional techniques. As illustrated in FIG. 6B, a native oxide 628 (e.g. silicon oxide on a silicon wafer) forms after the trenches are formed due to air exposure. The oxide is selectively removed from the substrate surface. For example, the native oxide is left on one side of the trench. As will be described in more detail below, the other side of the trench will serve to seed a recrystallization process. However, recrystallization will not be initiated on surfaces with the native oxide. As illustrated in FIG. 6C, an amorphous semiconductor 629 is deposited to fill the trenches. Where the substrate is a crystalline silicon wafer, for example, an amorphous silicon can be deposited. The resulting structure is planarized, such as by a chemical mechanical polishing (CMP) process, to the level of the original substrate surface, as illustrated in FIG. 6D. The resulting structure is heat treated to recrystallize the amorphous semiconductor 629 in the isolation trenches. Recrystallization will proceed only from the surfaces without native oxide. The recrystallization process is illustrated by arrows 630. The density of amorphous semiconductor is lower than crystalline semiconductor. During recrystallization the crystalline volume is not sufficient to fill the trenches, which places the adjoining crystalline semiconductor regions under tensile stress.

Figure 6E:
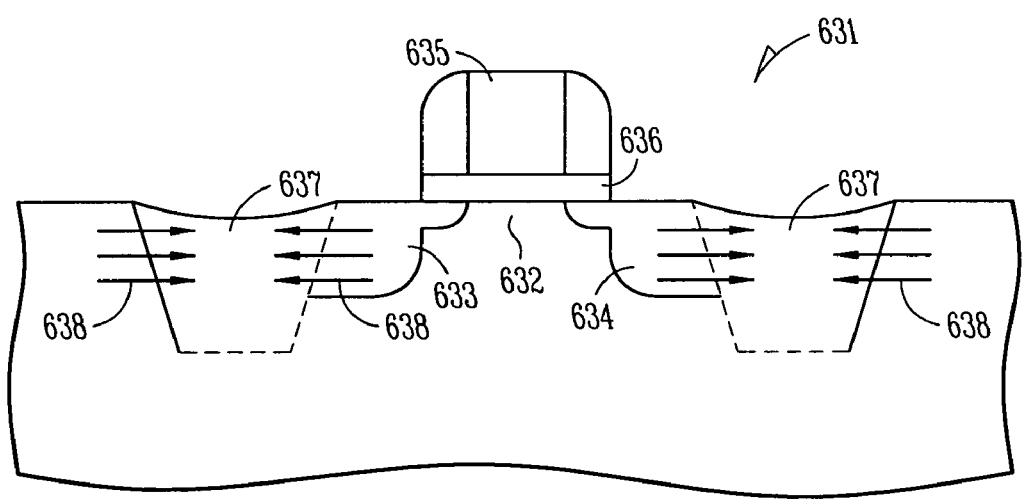

FIG. 6E illustrates an NMOS transistor 631 with a tensile strained n-channel 632 to improve electron mobility, according to various embodiments. The illustrated device 631 includes a first source/drain region 633 and a second source/drain region 634 that define the channel region 632 in the crystalline substrate. A gate 635 is separated from the channel region 632 by a gate insulator 636. The contracted, recrystallized isolation regions 637 cause the crystalline substrate upon which the NMOS transistor is formed to be under tensile stress, as illustrated by the arrows 638. With proper modeling there can be a large tensile strain in the direction of the transistor channel of a NMOS transistor.

FIGS. 5C and 6E illustrate PMOS and NMOS, respectively. One of ordinary skill in the art would understand how to provide strained channels for other p-channel and n-channel devices, including non-volatile memories such as floating gate devices.

Figure 7A:
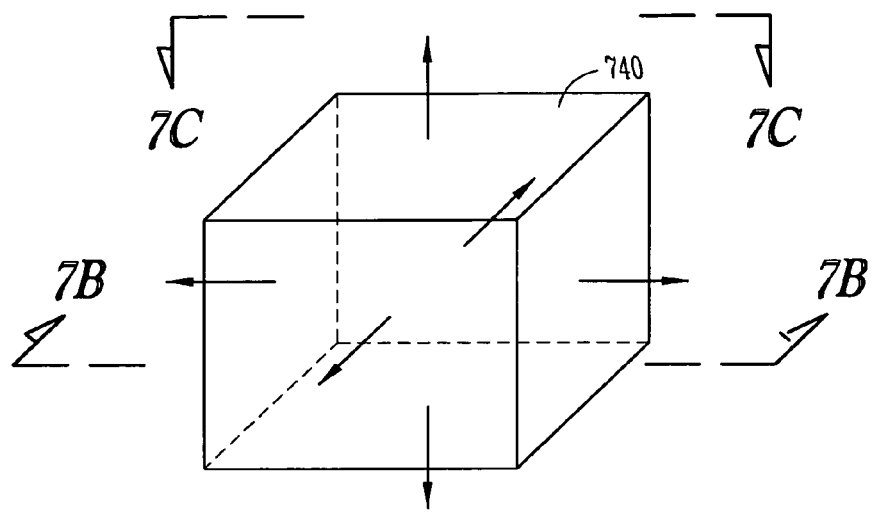
FIGS. 7A-7C illustrate an expanding isolation region volume and corresponding stresses, including a compressive stress, in adjacent channel regions, according to various embodiments of the present subject matter.
Figure 7B:
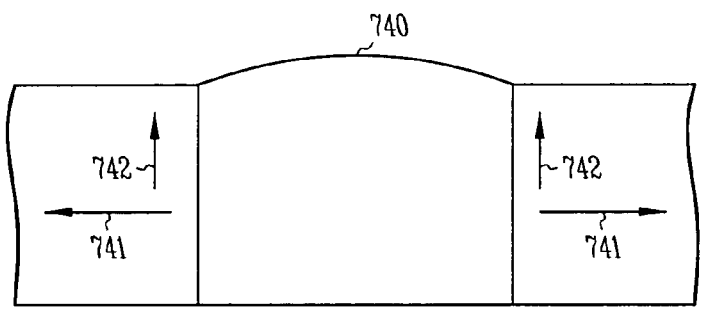
Figure 7C:
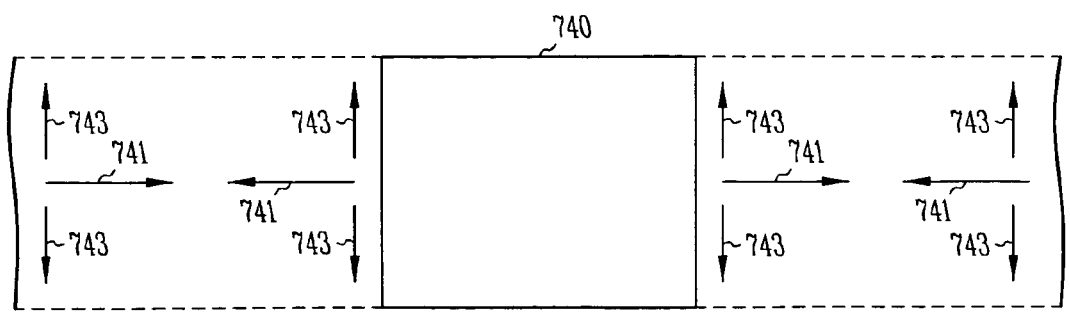
Figure 8A:
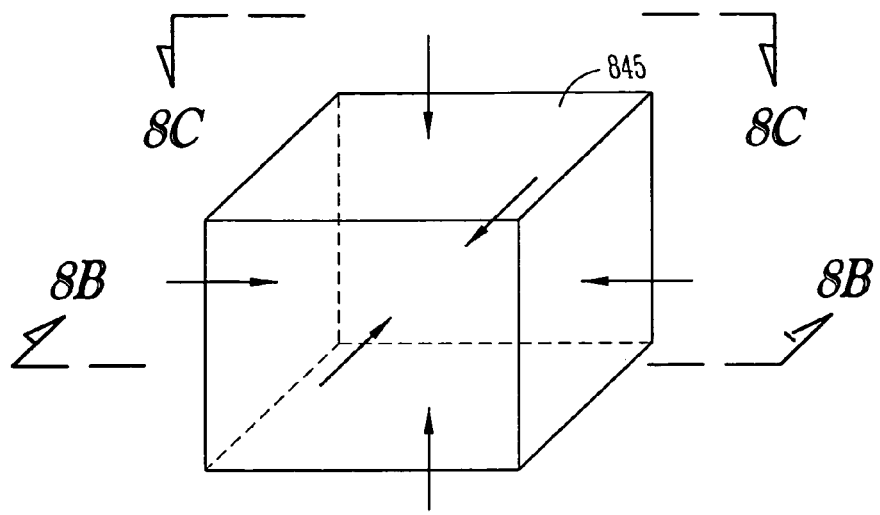
FIGS. 8A-8C illustrate a contracting isolation region volume and corresponding stresses, including a tensile stress, in adjacent channel regions, according to various embodiments of the present subject matter.
Figure 8B:
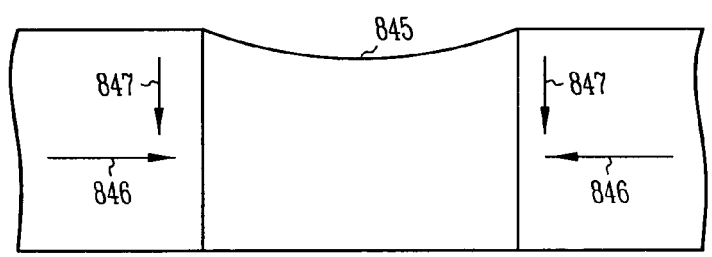
Figure 8C:
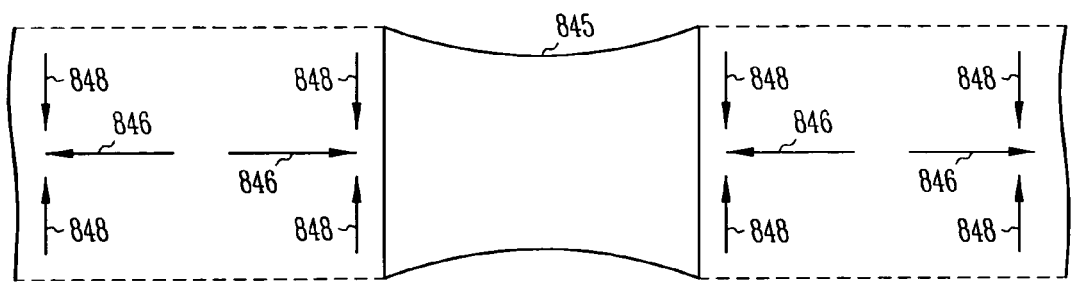

Thus, it has been illustrated how the adjusted volume of isolation regions can provide the desired compressive or tensile strain in the channel direction, referred to herein as the x-direction. There are also stresses applied in the direction into the paper (referred to herein as the y-direction) and the vertical direction (referred to herein as the z-direction). FIGS. 7A-7C illustrate forces associated with an expanding isolation region; and FIGS. 8A-8C illustrate forces associated with a contracting isolation region.

FIGS. 7A-7C illustrate an expanding isolation region volume and corresponding stresses, including a compressive stress, in adjacent channel regions, according to various embodiments of the present subject matter. With respect to the expanding isolation regions 740, the volume tends to grow in all directions (x, y and z), as illustrated in FIG. 7A. The corresponding compressive forces in the x-direction (the channel direction) are illustrated in FIGS. 7B and 7C by arrows 741. However, as the volume 740 expands, the volume pulls vertically on the surrounding crystalline regions, resulting in a vertically-oriented tensile strain, illustrated in FIG. 7B by arrows 742. Additionally, the expanding volume pulls on the surrounding crystalline regions in the y-direction too, resulting in a corresponding tensile strain 743 illustrated in FIG. 7C.

The tensile strain 743 in the y-direction can be avoided by having the amorphous isolation regions 740 constrained in the y-direction. One example for constraining the expanding isolation region includes limiting the extent of the isolation trenches in the y-direction. For example, the area to be implanted is masked in both the x-direction and y-direction to delineate the area in which the implant is to take place and therefore delineate the x and y regions to be strained. In the z-direction the implant location is controlled by the implant energy, as the locus of the implanted species in the silicon is deeper with higher implant energies. In the z-direction, the edges of the implanted region are constrained by the un-implanted material. The implanted material wishes to move vertically and the un-implanted material does not. At the interface between the implanted and unimplanted material, the implanted material is under compression and the un-implanted material is in tension 742. With proper modeling, there can still be a large compressive strain in the direction of the transistor channel of a PMOS transistor.

The tensile strain in the y-direction and z-direction does not negatively affect hole mobility when the structure is compressively strained in the x-direction to improve hole mobility. The channel area has a x, y and z dimension. The diffusions can be formed before or after the channel is strained. If the diffusions are in place prior to the introduction of the stress in the channel, the structure can be designed to provide as near as possible a uniform strain throughout the channel. The implanting and activating of the diffusions can change the strain locus if the diffusions are implanted and activated after the channel is strained.

FIGS. 8A-8C illustrate a contracting isolation region volume and corresponding stresses, including a tensile stress, in adjacent channel regions, according to various embodiments of the present subject matter. With respect to the contracting isolation regions 845, the volume tends to contract in all directions (x, y and z), as illustrated in FIG. 8A. The corresponding tensile forces in the x-direction (the channel direction) are illustrated in FIGS. 7B and 7C by arrows 846. However, as the volume 845 contracts, the volume pulls vertically on the surrounding crystalline regions, resulting in a vertically-oriented compressive strain, illustrated in FIG. 8B by arrows 847. Additionally, the contracting volume pulls on the surrounding crystalline regions in the y-direction too, resulting in a corresponding compressive strain 848 illustrated in FIG. 8C.

There is some residual compressive stress in the y-direction and z-direction if the isolation regions are recrystallized to provide tensile strain in the x-direction, but this does not negatively affect electron mobility enhancement. The expanding or contracting volume imposes an equal and opposite strain on each side of the interface in all three directions. If an isotropic material is implanted, such that there is an equal distribution of the implanted species in all areas of a cube, then the cube will wish to grow an equal amount in all directions (x, y, z). However, if the cube is constrained in one direction, the stress in each direction will be the same but the growth (strain) in the constrained direction will be less.

Figure 9:
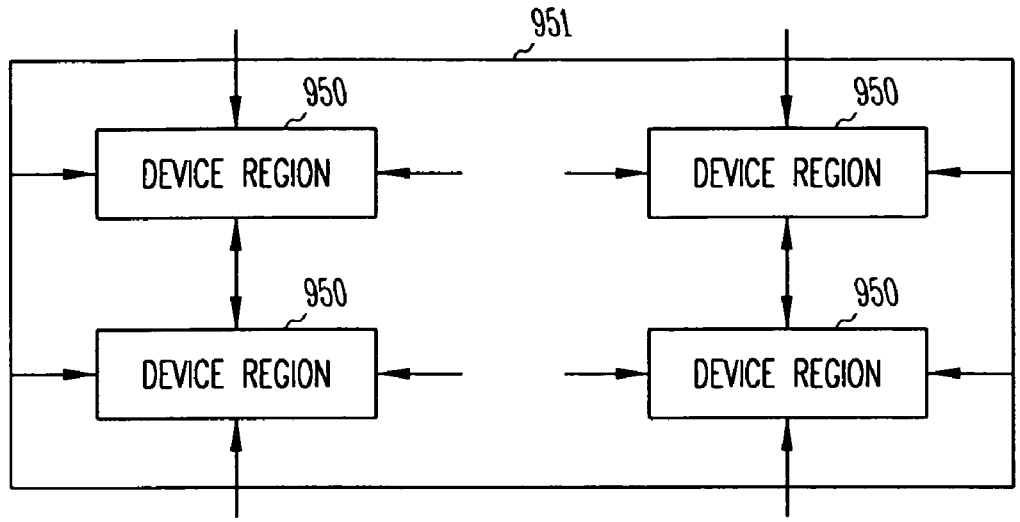
FIG. 9 illustrates a top view of device channel regions under compressive stress due to expanded isolation regions.

FIG. 9 illustrates a top view of device regions under compressive stress due to expanded isolation regions. Device regions 950, including device channel regions, are illustrated in a substrate. Isolation regions 951 define the device regions 950. As illustrated in FIG. 9, as the isolation regions expand, due to an implant in a crystalline semiconductor for example, the device regions are compressively strained. The expanding isolation regions can be defined to provide uniaxial compressive strain or biaxial compressive strain.

Figure 10:
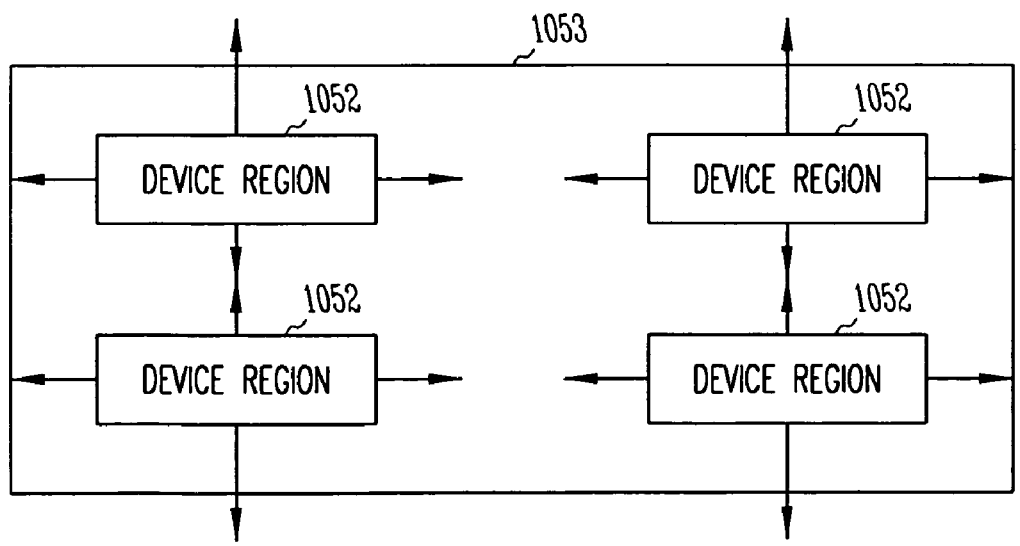
FIG. 10 illustrates a top view of device channel regions under tensile stress due to contracted isolation regions.

FIG. 10 illustrates a top view of device regions under tensile stress due to contracted isolation regions. Device regions 1052, including device channel regions, are illustrated in a substrate. Isolation regions 1053 define the device regions 1052. As illustrated in FIG. 10, as the isolation regions contract, due to recrystallization of an amorphous semiconductor for example, the device regions have a tensile strain. The contracting isolation regions can be defined to provide uniaxial tensile strain or biaxial tensile strain.

The isolation regions can be appropriately defined to provide a desired strain when the volume of the isolation regions are adjusted. Thus, for example, various embodiments adjust the volumes of isolation regions on a first side and on an opposing second side of the device region to provide a predominantly uniaxial strain. Various embodiments adjust volumes of isolation regions surrounding the device region to provide a predominantly biaxial strain.

Figure 11:
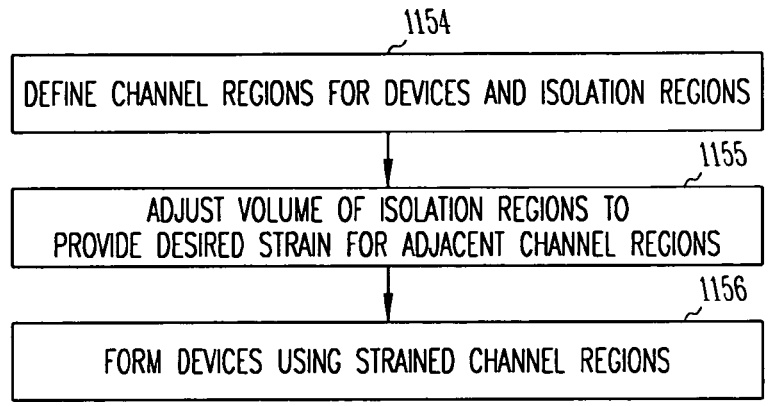
FIG. 11 illustrates a method for forming a device with a strained channel, according to various embodiments of the present subject matter.

FIG. 11 illustrates a method for forming a device with a strained channel, according to various embodiments of the present subject matter. At 1154, device channel regions and isolation regions are defined. The volume of the isolation regions are adjusted at 1155. For example, the isolation region can be expanded by implanting ions into a crystalline region. Various embodiments implant silicon ions or inert gases into a crystalline silicon substrate to transform the crystalline isolation regions into an expanded, amorphous isolation region. In another example, the isolation region can be retracted by recrystallizing an amorphous semiconductor. The adjusted volume induces a desired strain in the adjacent device channel regions. A compressive strain to improve hole mobility for a PMOS transistor can be induced by expanding the adjacent isolation regions. A tensile strain to improve electron mobility for an NMOS transistor can be induced by contracting the adjacent isolation regions. At 1156, devices are formed using the strained channel regions. P-channel devices, such as a PMOS transistor, are formed using the compressive strained channel regions, and N-channel devices, such as a NMOS transistor, are formed using the tensile strained channel regions. In various embodiments, the devices are formed before the volumes of the isolation regions are adjusted to induce the strain in the channel regions.

Figure 12:
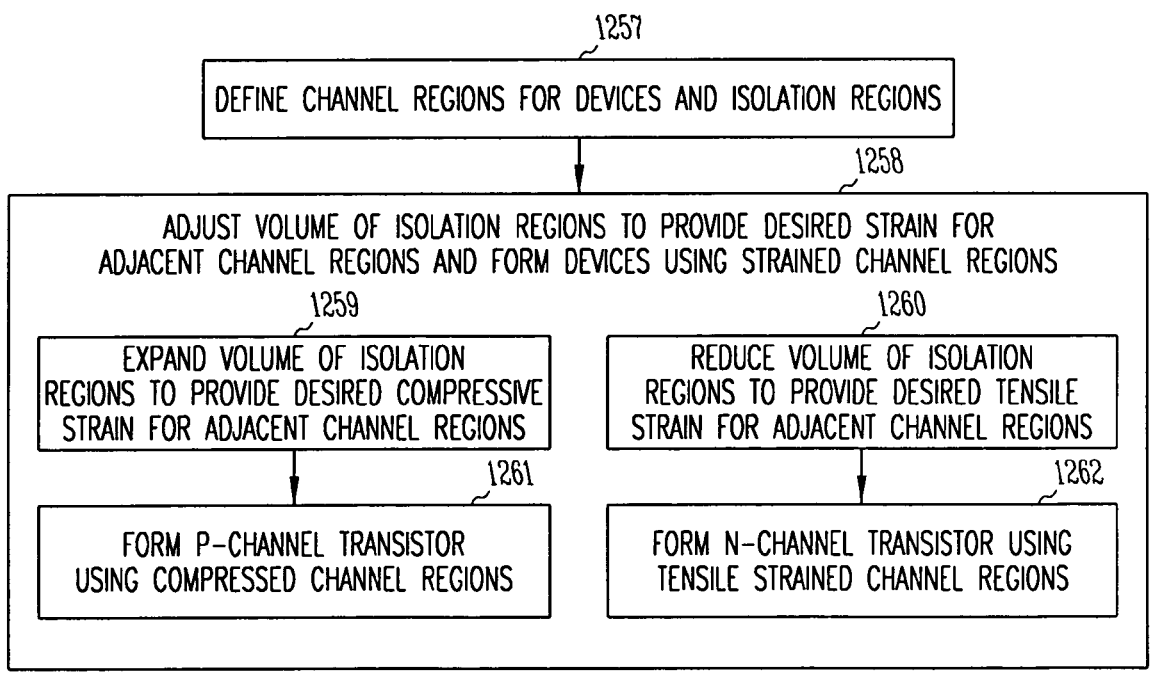
FIG. 12 illustrates a method for forming p-channel and n-channel devices with appropriately strained channels, according to various embodiments of the present subject matter.

FIG. 12 illustrates a method for forming p-channel and n-channel devices with appropriately strained channels, according to various embodiments of the present subject matter. Those of ordinary skill in the art, upon reading and comprehending this disclosure, will understand that the disclosed methods for straining semiconductor can be used in CMOS technology. Appropriate masking of isolation regions adjacent to NMOS devices and isolation regions adjacent to PMOS devices can be used to selectively expand the isolation regions adjacent to the PMOS channels to compressively strain the PMOS channels and improve hole mobility, and to selectively contract the isolation regions adjacent to the NMOS channels to tensile strain the NMOS channels and improve electron mobility. At 1257, device channel regions and isolation regions are defined, and devices are formed using the strained channel regions. At 1258, the volume of isolation regions is adjusted to provide the desired strain for adjacent channel regions. Devices are formed using the strained channel regions. For p-channel transistors, the volume of isolation regions are expanded at 1259 to provide the desired compressive strain for adjacent p-channel regions. For n-channel transistors, the volume of the isolation regions are contracted at 1260 to provide the desired tensile strain for adjacent n-channel regions. P-channel transistors are formed using the compressed channel regions at 1261, and n-channel transistors are formed using the tensile strained channel regions at 1262.

According to various embodiments, the process to provide a desired compressive strain for a p-channel device includes engineering the process to induce a compressive strain within a range of approximately 0.2% and 1.0%. According to various embodiments, the process to provide a desired tensile strain for an n-channel device includes engineering the process to induce a tensile strain greater than approximately 0.5%. For example, various embodiments provide a tensile strain within a range of approximately 0.75% to approximately 1.5%. It is also desirable to reduce unnecessary strain and provide a margin for error without unduly affecting the mobility enhancement. Thus, it is desirable to provide a tensile strain in the range of approximately 1% to approximately 1.2%.

The strain level is controlled by the size of the implanted region and the implant dose and the implant species. Larger implant regions correspond to larger strains, higher implant doses correspond to larger strains, and larger implant species correspond to larger strains. Other factors, such as the minimum photo dimension, are likely to determine the volume of the implanted region; thus, the implant dose and species are likely to be used to engineer the strain. The implant energy is controlled to determine the depth of the maximum stressed area. Various embodiments use multiple implant energies to increase the vertical dimension in which the maximum strain is achieved. The implant dose and species also increase the strain. The volume of the recrystallized material controls the level of tensile strain.

Figure 13:
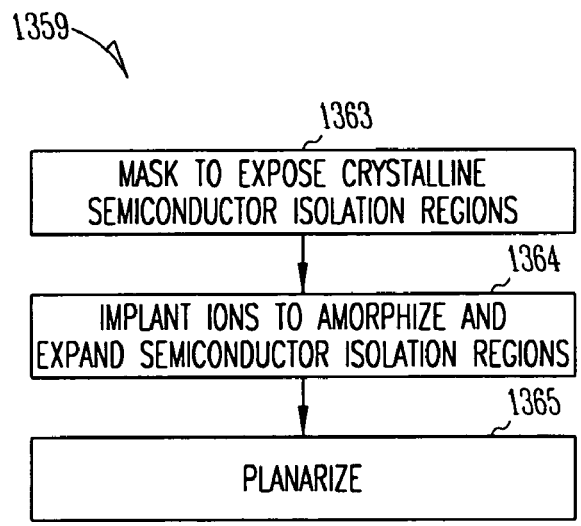
FIG. 13 illustrates a method for expanding isolation regions to provide compressive stress in adjacent semiconductor regions.
Figure 14:
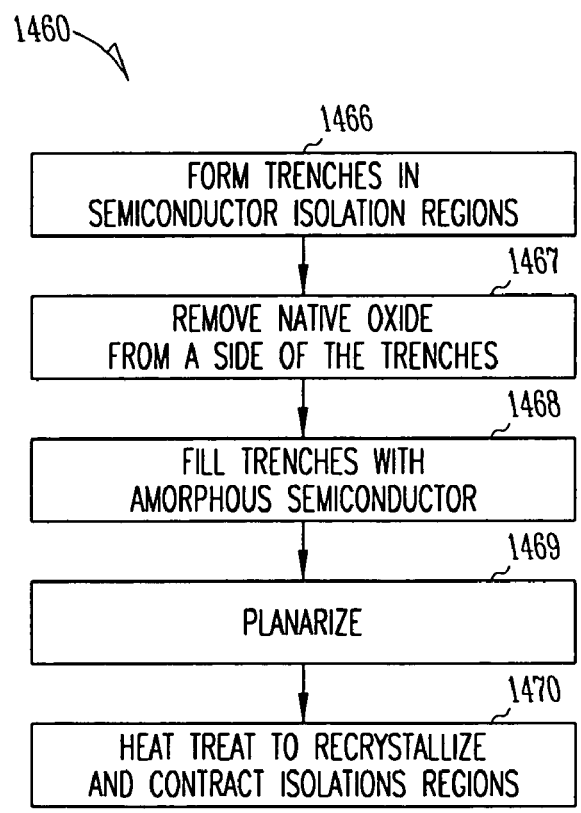
FIG. 14 illustrates a method for contracting isolation regions to provide tensile stress in adjacent semiconductor regions.

FIG. 13 illustrates a method for expanding isolation regions to provide compressive stress in adjacent semiconductor regions. The illustrated method 1359 is an embodiment of a process for expanding the volume of isolation regions, such as is illustrated at 1259 in FIG. 12. At 1363, the substrate (e.g. crystalline silicon substrate) is appropriately masked to expose semiconductor isolation regions. Ions are implanted at 1364 to amorphize and expand the semiconductor isolation regions. Various embodiments implant silicon ions into a crystalline silicon substrate to expand the isolation regions. Various embodiments implant an inert gas to expand the isolation regions. At 1365, the structure is planarized in preparation to form devices with compressed p-channels FIG. 14 illustrates a method for contracting isolation regions to provide tensile stress in adjacent semiconductor regions. The illustrated method 1460 is an embodiment of a process for reducing or contracting the volume of isolation regions, such as is illustrated at 1260 in FIG. 12. At 1466, trenches are formed in semiconductor isolation regions. For example, a mask can be formed to expose the semiconductor isolation regions, and these regions can be etched to form the trenches. At 1467, native oxide (e.g. silicon oxide on a silicon substrate) that forms from air exposure is selectively removed to expose a side of the trench for use in seeding a recrystallization process. At 1468, the trenches are formed with an amorphous semiconductor. In various embodiments, the amorphous semiconductor is of the same type as the semiconductor substrate, such that an amorphous silicon is deposited to fill trenches formed in a silicon wafer, for example. The resulting structure is planarized at 1469, and heat treated at 1470 to recrystallize the amorphous semiconductor. The crystal growth is seeded by the crystalline semiconductor where the native oxide has been removed. This transformation of this volume from an amorphous volume into a crystalline volume reduces or contracts the volume.

Figure 15:
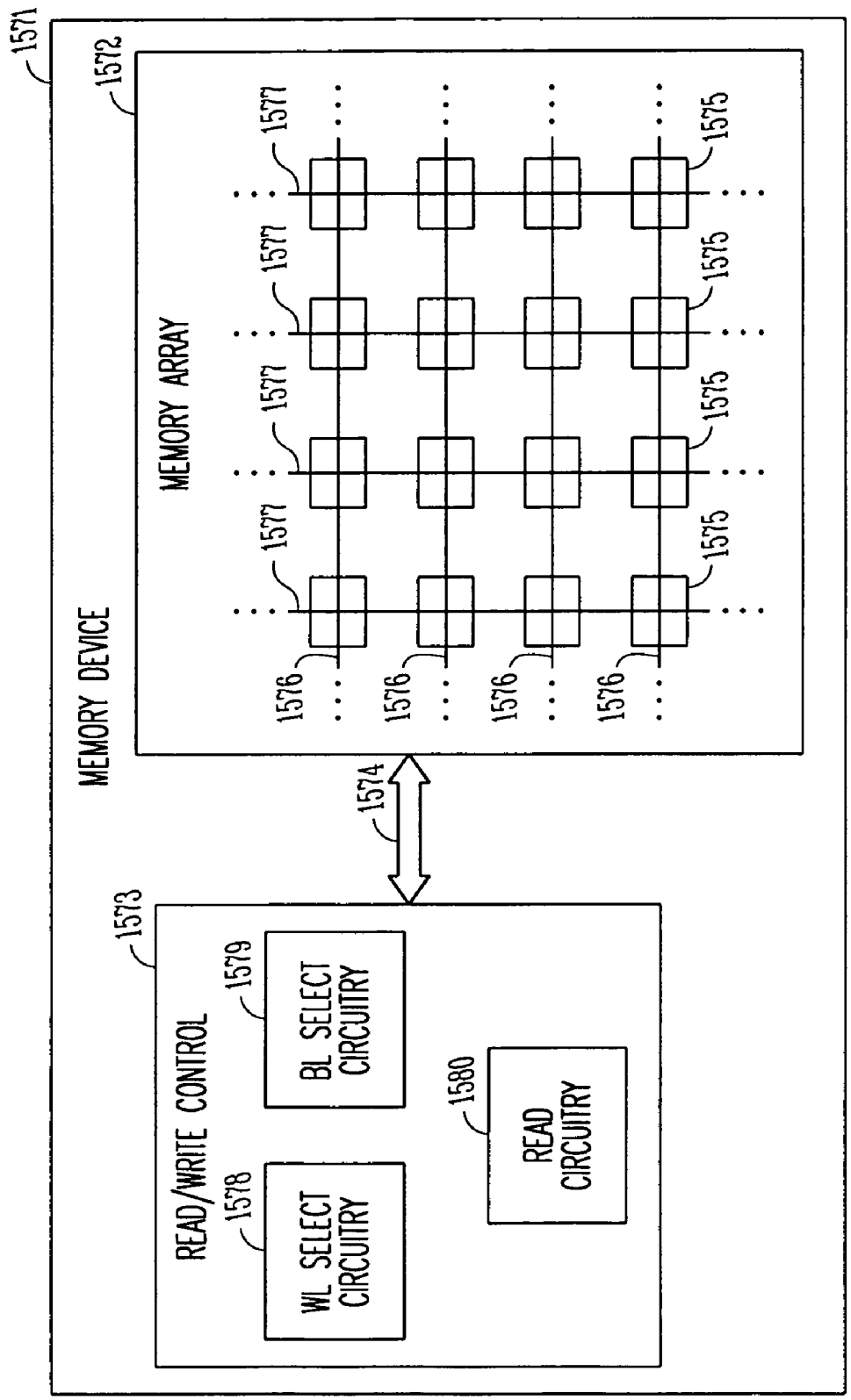
FIG. 15 is a simplified block diagram of a high-level organization of various embodiments of a memory device according to various embodiments of the present subject matter.

FIG. 15 is a simplified block diagram of a high-level organization of various embodiments of a memory device according to various embodiments of the present subject matter. The illustrated memory device 1571 includes a memory array 1572 and read/write control circuitry 1573 to perform operations on the memory array via communication line(s) or channel(s) 1574. The illustrated memory device 1571 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry are able to be fabricated using the strained semiconductor, as described above. For example, in various embodiments, the memory array and/or the control circuitry include p-channel transistors with compressively-strained channels for improved hole mobility and/or n-channel transistors with tensile-strained channels for improved electron mobility. The structure and fabrication methods for these devices have been described above.

The illustrated memory array 1572 includes a number of memory cells 1575 arranged in rows and columns, where word lines 1576 connect the memory cells in the rows and bit lines 1577 connect the memory cells in the columns. The read/write control circuitry 1573 includes word line select circuitry 1578, which functions to select a desired row. The read/write control circuitry 1573 further includes bit line select circuitry 1579, which functions to select a desired column. The read/write control circuitry 1573 further includes read circuitry 1580, which functions to detect a memory state for a selected memory cell in the memory array 1572.

Figure 16:
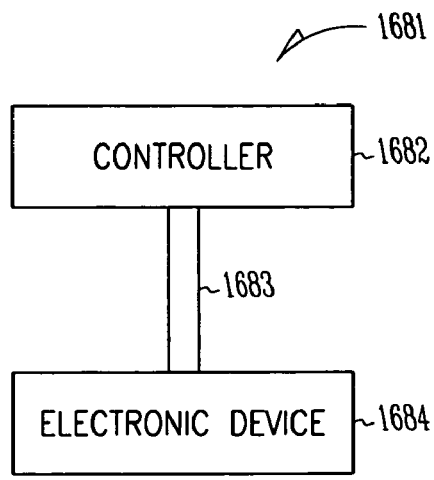
FIG. 16 illustrates a diagram for an electronic system having one or more transistors with strained channels for improved mobility, according to various embodiments of the present subject matter.

FIG. 16 illustrates a diagram for an electronic system having one or more transistors with strained channels for improved mobility, according to various embodiments of the present subject matter. Electronic system 1681 includes a controller 1682, a bus 1683, and an electronic device 1684, where the bus 1683 provides communication channels between the controller 1682 and the electronic device 1684. In various embodiments, the controller and/or electronic device include p-channel transistors with compressively-strained channels and/or n-channel transistors with tensile-strained channels as previously discussed herein. The illustrated electronic system 1681 may include, but is not limited to, information handling devices, wireless systems, telecommunication systems, fiber optic systems, electro-optic systems, and computers.

Figure 17:
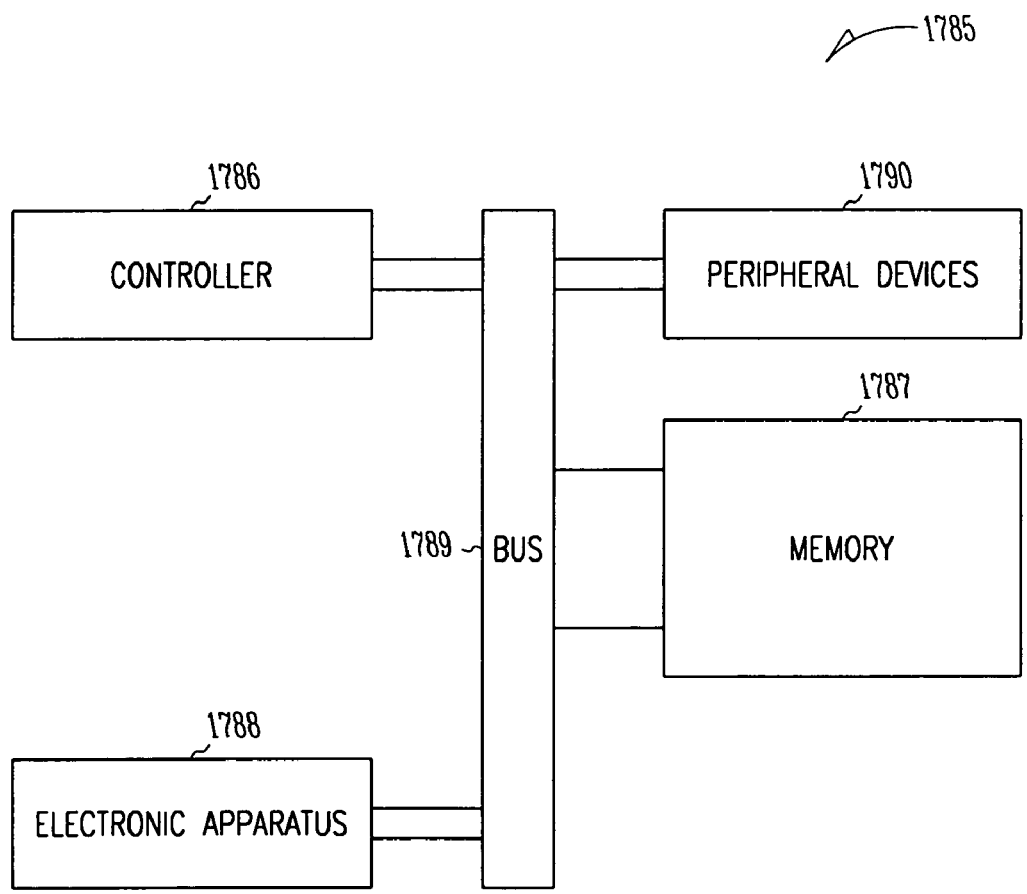
FIG. 17 illustrates an embodiment of a system having a controller and a memory, according to various embodiments of the present subject matter.

FIG. 17 illustrates an embodiment of a system 1785 having a controller 1786 and a memory 1787, according to various embodiments of the present subject matter. The controller 1786 and/or memory 1787 may include p-channel transistors with compressively-strained channels and/or n-channel transistors with tensile-strained channels fabricated according to various embodiments. The illustrated system 1785 also includes an electronic apparatus 1788 and a bus 1789 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1788 may be additional memory configured similar to memory 1787. An embodiment may include a peripheral device or devices 1790 coupled to the bus 1789. Peripheral devices may include displays, additional storage memory, or other control devices that may operate in conjunction with the controller and/or the memory. In an embodiment, the controller is a processor. Any of the controller 1786, the memory 1787, the electronic apparatus 1788, and the peripheral devices 1790 may include p-channel transistors with compressively-strained channels and/or n-channel transistors with tensile-strained channels formed according to various embodiments. The system 1785 may include, but is not limited to, information handling devices, telecommunication systems, and computers. Applications containing strained semiconductor films, such as p-channel transistors with compressively-strained channels, as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as cameras, video recorders and players, televisions, displays, games, phones, clocks, personal computers, wireless devices, automobiles, aircrafts, industrial control systems, and others.

The memory may be realized as a memory device containing p-channel transistors with compressively-strained channels formed according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM).

This disclosure includes several processes, circuit diagrams, and semiconductor structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A method, comprising:
   defining a device region in a semiconductor substrate and isolation regions adjacent to the device region, the device region having a channel region, and the isolation regions having volumes; and
   adjusting the volumes of the isolation regions to provide the channel region with a desired strain,
   wherein adjusting the volumes of the isolation regions includes expanding the volumes of the isolation regions to provide the channel region with a desired compressive strain, and expanding the volumes of the isolation regions includes transforming the isolation regions from a crystalline region to an amorphous region.

2. The method of claim 1, further comprising forming a device, the device including the strained channel region.

3. The method of claim 1, wherein the desired strain in the channel region includes a predominant uniaxial strain in a channel direction.

4. The method of claim 1, wherein the desired strain in the channel region includes a predominant biaxial strain.

5. The method of claim 1, wherein the semiconductor substrate includes a silicon substrate.

6. The method of claim 1, wherein the desired strain includes a compressive strain within a range of approximately 0.2% to approximately 1.0%.

7. A method, comprising:
   defining a p-channel device region in a semiconductor substrate and isolation regions adjacent to the p-channel device region, the p-channel device region having a p-channel region, and the isolation regions having volumes;
   expanding the isolation regions to compressively strain the p-channel region; and
   forming a p-channel device in the p-channel device region, the p-channel device including the p-channel region,
   wherein expanding the isolation regions includes transforming the isolation regions from a crystalline region to an amorphous region.

8. A method, comprising:
   defining a p-channel device region in a semiconductor substrate and isolation regions adjacent to the p-channel device region, the p-channel device region having a p-channel region, and the isolation regions having volumes;
   expanding the isolation regions to compressively strain the p-channel region; and
   forming a p-channel device in the p-channel device region, the p-channel device including the p-channel region,
   wherein expanding the isolation regions includes implanting ions into the isolation regions.

9. The method of claim 7, wherein expanding the isolation regions to compressively strain the p-channel region includes expanding the isolation regions to provide a predominantly uniaxial strain in the p-channel region.

10. A method, comprising:
    masking a crystalline substrate to expose crystalline isolation regions adjacent to and on opposing sides of a p-channel device region in the crystalline substrate; and
    implanting ions into the isolation regions to compressively strain the p-channel device region.

11. The method of claim 10, further comprising forming a p-channel device in the p-channel device region.

12. The method of claim 10, wherein the crystalline substrate includes a silicon substrate.

13. The method of claim 12, wherein the ions includes silicon ions.

14. The method of claim 10, wherein the ions include inert gas ions.

15. The method of claim 10, wherein implanting ions into the isolation regions to compressively strain the p-channel device region includes implanting ions to induce a strain within a range of approximately 0.2% to approximately 1.0%.

16. A method, comprising:
 defining an n-channel device region in a semiconductor substrate and isolation regions adjacent to the n-channel device region, the n-channel device region having an n-channel region, and the isolation regions having volumes;
 contracting the isolation regions to tensile strain the n-channel region; and
 forming an n-channel device in the n-channel device region, the n-channel device including the n-channel region,
 wherein contracting the isolation regions includes transforming the isolation regions from an amorphous region to a crystalline region.

17. The method of claim 16, wherein transforming the isolation regions includes crystallizing amorphous silicon in a trench in the semiconductor substrate.

18. The method of claim 16, wherein contracting the isolation regions includes contracting the isolation regions to provide a predominately uniaxial strain.

19. A method, comprising:
 forming trenches in a crystalline semiconductor substrate adjacent to and on opposing sides of an n-channel device region in the crystalline substrate; and
 filling the trenches with amorphous semiconductor and crystallizing the amorphous semiconductor to provide a tensile strain to the n-channel device region.

20. The method of claim 19, further comprising forming an n-channel device in the n-channel device region.

21. The method of claim 19, wherein the crystalline substrate includes a silicon substrate.

22. The method of claim 21, wherein the amorphous semiconductor includes an amorphous silicon.

23. The method of claim 19, wherein the tensile strain includes a strain greater than approximately 0.5%.

24. The method of claim 19, wherein the tensile strain includes a strain within a range of approximately 0.75% to approximately 1.5%.

25. The method of claim 19, further comprising selectively removing a native oxide from a portion of the trenches before filling the trenches with amorphous semiconductor to seed crystalline growth.

26. A method for forming a CMOS device, comprising:
 defining a p-channel device region in a semiconductor substrate and first isolation regions adjacent to the p-channel device region and defining an n-channel device region in a semiconductor substrate and isolation regions adjacent to the n-channel device region, the p-channel device region having a p-channel region, the n-channel device region having an n-channel region, and the first and second isolation regions having volumes;
 expanding the first isolation regions to compressively strain the p-channel region and contracting the second isolation regions to tensile strain the n-channel region; and
 forming a p-channel device in the p-channel device region and an n-channel device in the n-channel device region, the p-channel device including the compressively-strained p-channel region and the n-channel device including the tensile strained n-channel region,
 wherein expanding the first isolation regions includes transforming the first isolation regions from a crystalline region to amorphous regions, and contracting the second isolation regions includes transforming the second isolation regions from an amorphous region to crystalline regions.

27. The method of claim 26, wherein expanding the first isolation regions to compressively strain the p-channel region includes providing a compressive strain within a range of approximately 0.2% and 1.0%.

28. The method of claim 26, wherein contracting the second isolation regions to tensile strain the n-channel region includes providing a tensile strain within a range of approximately 0.75% to 1.5%.

29. A method, comprising:
 defining a device region in a semiconductor substrate and isolation regions adjacent to the device region, the device region having a channel region, and the isolation regions having volumes; and
 adjusting the volumes of the isolation regions to provide the channel region with a desired strain,
 wherein adjusting the volumes of the isolation regions includes contracting the volumes of the isolation regions to provide the channel region with a desired tensile strain, and contracting the volumes of the isolation regions includes transforming the isolation regions from an amorphous region to a crystalline region.

30. The method of claim 29, further comprising forming a device, the device including the strained channel region.

31. The method of claim 29, wherein the desired strain in the channel region includes a predominant uniaxial strain in a channel direction.

32. The method of claim 29, wherein the desired strain in the channel region includes a predominant biaxial strain.

33. The method of claim 29, wherein the semiconductor substrate includes a silicon substrate.

34. The method of claim 29, wherein the desired strain includes a tensile strain greater than approximately 0.5%.

35. The method of claim 29, wherein the desired strain includes a tensile strain within a range of approximately 0.75% to approximately 1.5%.

* * * * *